(12) United States Patent
Rao et al.

(10) Patent No.: US 11,209,472 B2
(45) Date of Patent: Dec. 28, 2021

(54) FULLY DISTRIBUTED MAGNETIC ADSORPTION MULTI-PARAMETER SENSING CABLE

(71) Applicants: Zhongtian Power Optical Cable Co.,Ltd, Jiangsu (CN); JIANGSU ZHONGTIAN TECHNOLOGY CO LTD, Jiangsu (CN); Sichuan Guangsheng IOT Technology Co.,Ltd., Sichuan (CN)

(72) Inventors: Yunjiang Rao, Sichuan (CN); Bing Han, Sichuan (CN); Hongjian Guan, Sichuan (CN); Qiang Li, Jiangsu (CN); Ming Li, Jiangsu (CN); Zengling Ran, Sichuan (CN); Jiping Xue, Jiangsu (CN); Shuhong Xie, Jiangsu (CN); Cangping He, Jiangsu (CN)

(73) Assignees: Zhongtian Power Optical Cable Co., Ltd, Jiangsu (CN); JIANGSU ZHONGTIAN TECHNOLOGY CO LTD, Jiangsu (CN); Sichuan Guangsheng IOT Technology Co., Ltd., Sichuan (CN)

(*) Notice: Subject to any disclaimer, the term of this patent is extended or adjusted under 35 U.S.C. 154(b) by 0 days.

(21) Appl. No.: 17/037,716

(22) Filed: Sep. 30, 2020

(65) Prior Publication Data

US 2021/0011068 A1   Jan. 14, 2021

(30) Foreign Application Priority Data

Apr. 1, 2020 (CN) .......................... 202010250819.9

(51) Int. Cl.
*G01R 29/08* (2006.01)
*G01R 33/032* (2006.01)

(52) U.S. Cl.
CPC ...... *G01R 29/0885* (2013.01); *G01R 29/0807* (2013.01); *G01R 33/0327* (2013.01)

(58) Field of Classification Search
CPC ............ G01R 29/0885; G01R 29/0807; G01R 33/0327; G01D 5/35358; G01K 11/3206; G01K 11/324; G01L 1/242; G01H 9/004
(Continued)

(56) References Cited

U.S. PATENT DOCUMENTS 10,775,425 B2 * 9/2020 Godfrey ............. G01D 5/35338
2003/0080847 A1 * 5/2003 Radzelovage .......... H01F 38/30
336/229

(Continued)

OTHER PUBLICATIONS

Almahmoud, Safieh, et al. "Feasibility of magnetic fiber-optic based corrosion sensor." Sensors and Smart Structures Technologies for Civil, Mechanical, and Aerospace Systems 2017. vol. 10168. International Society for Optics and Photonics, 2017. (Year: 2017).*

(Continued)

*Primary Examiner* — Christopher P McAndrew

(57) ABSTRACT

A fully distributed magnetic adsorption multi-parameter sensing cable, which is configured to be installed on the wall of a metal pipeline, includes an outer sheath, a sensing component arranged in the outer sheath, and a fully distributed magnetic adsorption reinforcement (FDMAR) arranged in the outer sheath and on a peripheral side of the sensing component. The outer sheath is attached to the wall of the metal pipeline by the FDMAR. A magnetic adsorption force between the FDMAR and the wall of the metal pipeline is able to be adjusted by changing the size of the FDMAR and the distance between the FDMAR reinforcement and the wall of the metal pipeline. The fully distributed magnetic adsorption multi-parameter sensing cable has the advantages of good adsorption effect and high sensitivity.

9 Claims, 7 Drawing Sheets

(58) Field of Classification Search
USPC .......................................................... 324/96
See application file for complete search history.

(56) References Cited

U.S. PATENT DOCUMENTS

| 2015/0128706 A1* | 5/2015 | Godfrey | G01N 29/09 |
| | | | 73/574 |
| 2016/0018245 A1* | 1/2016 | Yamate | G01V 8/00 |
| | | | 250/227.14 |
| 2019/0348213 A1* | 11/2019 | Ikarashi | H01F 27/321 |

OTHER PUBLICATIONS

Inaudi, Daniele, and Branko Glisic. "Long-range pipeline monitoring by distributed fiber optic sensing." Journal of pressure vessel technology 132.1 (2010). (Year: 2010).*

Frings, J., and T. Walk. "Pipeline leak detection using distributed fiber optic sensing." 3R international• Special-Edition 2 (2010): 57-61. (Year: 2010).*

* cited by examiner

FULLY DISTRIBUTED MAGNETIC ADSORPTION MULTI-PARAMETER SENSING CABLE

CROSS REFERENCE OF RELATED APPLICATION

This application claims priority to CN Patent Application Serial Number 202010250819.9, filed in SIPO on Apr. 1, 2020, the disclosure of which is incorporated herein by reference.

BACKGROUND OF THE PRESENT INVENTION

Field of Invention

The present invention relates to optical cables and distributed optical fiber sensing (DOFS) technology, and in particular to a fully distributed magnetic adsorption multi-parameter sensing cable.

Description of Related Arts

The DOFS technology utilizes the scattered light for sensing, and is able to detect the external physical parameters such as strain and temperature in a wide range and with high precision. It has been widely used in the fields of border security, rail safety, structural health monitoring, fire alarm, et al. For example, distributed acoustic sensing (DAS) technology quantitatively restores the position, amplitude, and frequency of the external sound field by detecting the phase difference change of the Rayleigh backscattered light in an optical fiber. Distributed temperature sensing (DTS) technology uses Raman scattering signals in an optical fiber to quantitatively monitor the external temperature field. Brillouin optical time-domain analyzer (BOTDA) technology uses linear relationships between the frequency shift of the Brillouin scattered light in an optical fiber and the strain or temperature change to achieve distributed measurement of the strain and temperature.

In practical applications of DOFS technologies, optical cables are used as a sensing medium. Existing sensing cables are mostly protected by multiple layers of armor so that they have low sensitivity. Sensing cables are usually set beside a metal pipeline in a freely approaching state for monitoring of leak in the metal pipeline and exploration of oil/gas in wells, and there are gaps between the cables and the metal pipeline. In this way, when there are stresses and strains on the metal pipeline, the sensing cables are difficult to effectively follow the deformation of the metal pipeline. When the temperature of the metal pipeline changes, the temperature field information transmitted to the sensing cables will be inaccurate. Moreover, it is difficult to effectively transmit seismic waves or pipeline leakage sound waves to the sensing cables. Therefore, the problem of effective coupling of strain, temperature, and sound waves to the sensing fibers must be solved. In addition, at present, most of sensing cables contain only a single-mode fiber, and multi-parameters such as the external sound wave, strain, and temperature are unable to be simultaneously measured.

SUMMARY OF THE PRESENT INVENTION

To overcome the above shortcomings, the present invention provides a fully distributed magnetic adsorption multi-parameter sensing cable.

The fully distributed magnetic adsorption multi-parameter sensing cable, which is installed on a wall of a metal pipeline, comprises an outer sheath, a sensing component arranged in the outer sheath, and a fully distributed magnetic adsorption reinforcement (FDMAR) arranged in the outer sheath and on a peripheral side of the sensing component, wherein the outer sheath is attached to the wall of the metal pipeline by the FDMAR, and a magnetic adsorption force between the FDMAR and the wall of the metal pipeline is adjusted by changing a size of the FDMAR and a distance between the FDMAR and the wall of the metal pipeline.

Preferably, one side of a cross section of the outer sheath perpendicular to an axial direction of the outer sheath is arc-shaped and matches a shape and a size of the wall of the metal pipeline.

Preferably, when the outer sheath is attached to an outer wall of the metal pipeline, the one side of the cross section of the outer sheath perpendicular to the axial direction of the outer sheath and attached to the outer wall of the metal pipeline is a concave arc; when the outer sheath is attached to an inner wall of the metal pipeline, the one side of the cross section of the outer sheath perpendicular to the axial direction of the outer sheath and attached to the inner wall of the metal pipeline is a convex arc.

Preferably, the sensing component comprises an elastic sensitizing component, a sensing fiber, and a sensitizing curing layer; the sensing fiber is disposed on a peripheral side of the elastic sensitizing component, the sensitizing curing layer is coated on the elastic sensitizing component and the sensing fiber.

Preferably, the sensing fiber comprises a strain sensing fiber and a temperature sensing fiber; the strain sensing fiber and the temperature sensing fiber are relatively disposed on the peripheral side of the elastic sensitizing component.

Preferably, the strain sensing fiber comprises a strain sensing fiber core, a strain sensing fiber cladding wrapped around strain sensing fiber core, and a strain sensing fiber coating wrapped around the strain sensing fiber cladding, the strain sensing fiber cladding has a diameter in a range of 40 μm to 125 μm, and the strain sensing fiber coating has a diameter in a range of 100 μm or greater.

Preferably, the temperature sensing fiber comprises a temperature sensing fiber core, a temperature sensing fiber cladding wrapped around the temperature sensing fiber core, and a temperature sensing fiber coating wrapped around the temperature sensing fiber cladding.

The fully distributed magnetic adsorption multi-parameter sensing cable of claim 5, wherein the temperature sensing fiber is a multimode fiber with a core diameter of 50 μm or 62.5 μm.

Preferably, the magnetic adsorption force between the FDMAR and the wall of the metal pipeline increases with an increase in a radius of the FDMAR, and the magnetic adsorption force between the FDMAR and the wall of the metal pipeline decreases with an increase in the distance between the FDMAR and the wall of the metal pipeline.

Preferably, the fully distributed magnetic adsorption multi-parameter sensing cable further comprises a tensile strength reinforcement arranged in the outer sheath, and disposed between the sensing component and the FDMAR.

According to the fully distributed magnetic adsorption multi-parameter sensing cable provided by the present invention, one side of the outer sheath is arc-shaped and is attached to the wall of the metal pipeline, the FDMAR is tightly attached to the wall of the metal pipeline by the magnetic adsorption force, so that the fully distributed magnetic adsorption multi-parameter sensing cable is more tightly attached to the wall of the metal pipeline.

Figure 1:
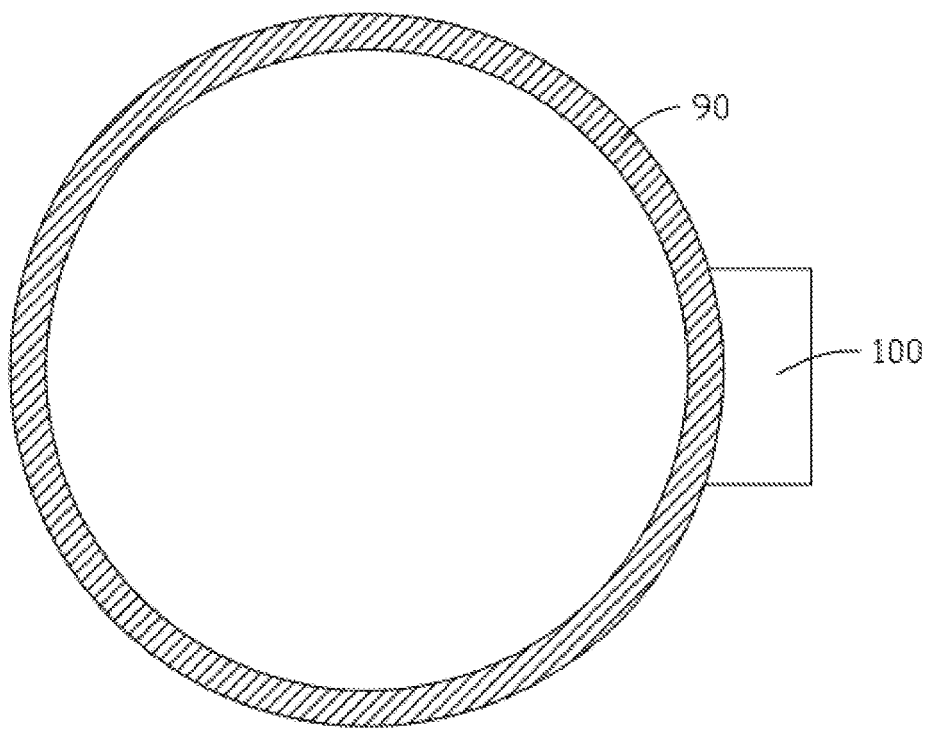
FIG. 1 is a schematic diagram of a connection structure of a fully distributed magnetic adsorption multi-parameter sensing cable and an outer wall of a metal pipeline according to a first preferred embodiment of the present invention.

In the drawings, 100: fully distributed magnetic adsorption multi-parameter sensing cable; 10: outer sheath; 20: sensing component; 21: elastic sensitizing component; 22: sensing fiber; 223: strain sensing fiber; 2231: strain sensing fiber core; 2232: strain sensing fiber cladding; 2233: strain sensing fiber coating; 224: temperature sensing fiber; 2241: temperature sensing fiber core; 2242: temperature sensing fiber cladding; 2243: temperature sensing fiber coating; 23: sensitizing curing layer; 30: fully distributed magnetic adsorption reinforcement (FDMAR); 40: tensile strength reinforcement; 90: metal pipeline.

DETAILED DESCRIPTION OF THE PREFERRED EMBODIMENT

In order to be able to more clearly understand the foregoing objectives, features, and advantages of the embodiments of the present application, the present application will be described in detail with reference to the accompanying drawings and specific embodiments as follows. It should be noted that the features in the embodiments of the present application are able to be combined with each other if there is no conflict.

In the following description, many specific details are set forth in order to fully understand the embodiments of the present application. The described embodiments are part of the embodiments of the present application, not all of the embodiments. Based on the embodiments in the present application, all other embodiments obtained by those skilled in the art without creative work are within the scope of disclosure of the embodiments of the present application.

Unless otherwise defined, all technical and scientific terms used herein have the same meaning as commonly understood by those skilled in the art belonging to the embodiments of the present application. The terms used in the description of the present invention are only for describing specific embodiments, and are not intended to limit the present invention.

The present invention will be described in detail with reference to the drawings and some embodiments as follows.

Figure 2:
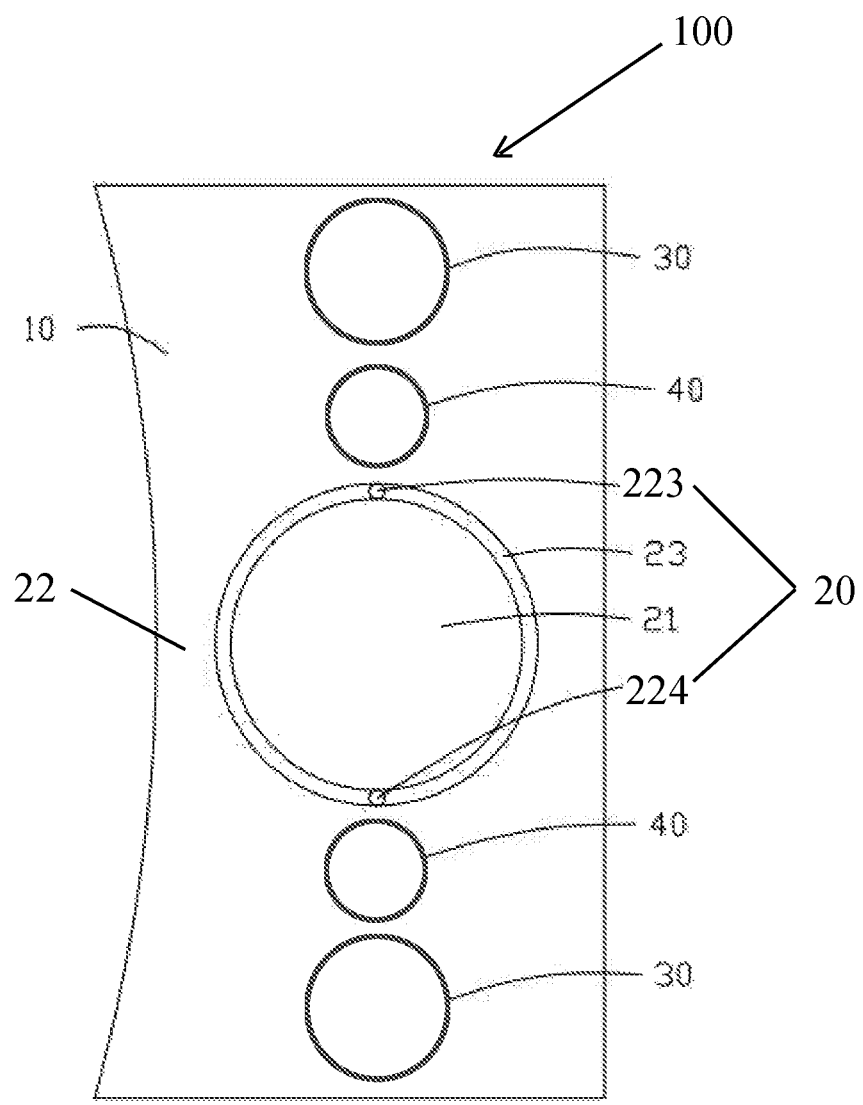
FIG. 2 is a structurally schematic diagram of the fully distributed magnetic adsorption multi-parameter sensing cable shown in FIG. 1.
Figure 3:
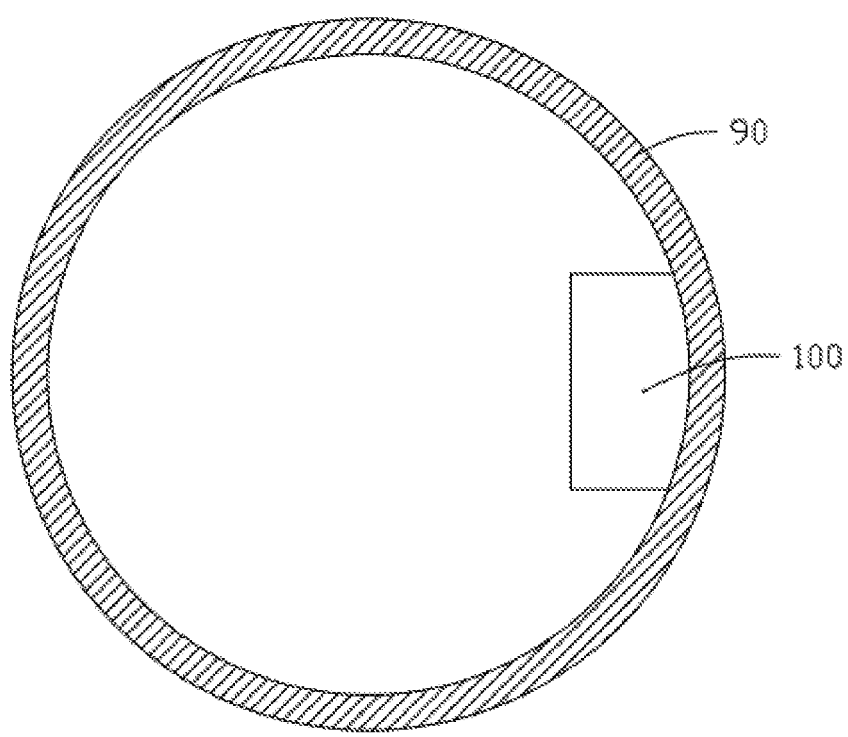
FIG. 3 a schematic diagram of a connection structure of a fully distributed magnetic adsorption multi-parameter sensing cable and an inner wall of a metal pipeline according to a second preferred embodiment of the present invention.
Figure 4:
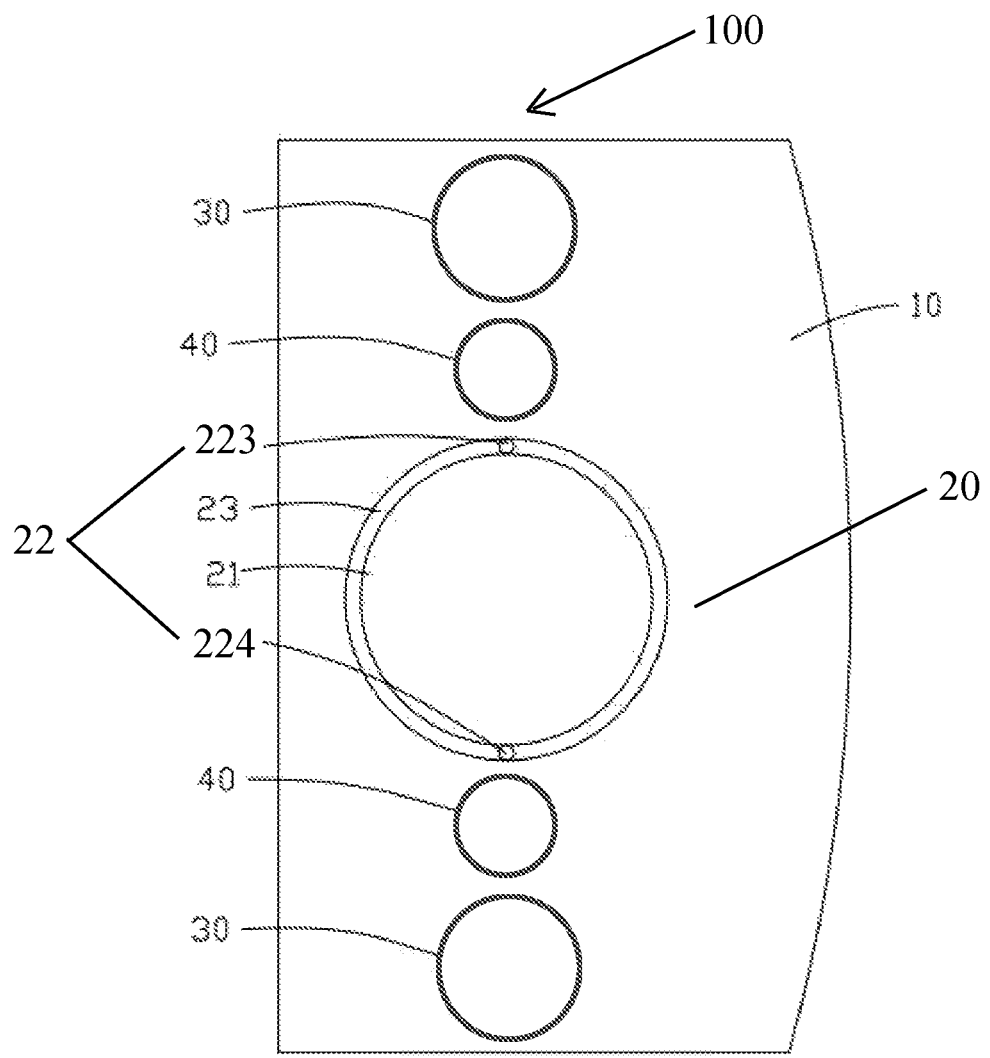
FIG. 4 is a structurally schematic diagram of the fully distributed magnetic adsorption multi-parameter sensing cable shown in FIG. 3.

Referring to FIGS. 1 to 4 of the drawings, a fully distributed magnetic adsorption multi-parameter sensing cable 100 is illustrated. The fully distributed magnetic adsorption multi-parameter sensing cable 100 is installed on a wall of a metal pipeline 90 for prospecting information therein. The fully distributed magnetic adsorption multi-parameter sensing cable 100 comprises an outer sheath 10, a sensing component 20 arranged in the outer sheath 10, multiple fully distributed magnetic adsorption reinforcements (FDMARs) 30, and multiple tensile strength reinforcements 40. Referring to FIGS. 1 and 3, the outer sheath 10 is attached to the wall of the metal pipeline 90. FIGS. 2 and 4 show the multiple FDMARs 30 are arranged on a peripheral side of the sensing component 20, so that the fully distributed magnetic adsorption multi-parameter sensing cable 100 is attached on the wall of the metal pipeline 90 by a magnetic adsorption force. One of the tensile strength reinforcements 40 is set between the sensing component 20 and one of the FDMARs 30 to improve mechanical properties of the fully distributed magnetic adsorption multi-parameter sensing cable 100.

In the drawings of the present invention, the outer sheath 10 is embodied to be strip-shaped. The sensing component 20, the FDMARs 30, and the tensile strength reinforcements 40 are arranged in the outer sheath 10 along an axial direction of the outer sheath 10. One side of a cross section of the outer sheath 10 perpendicular to the axial direction is arc-shaped. The arc-shaped side of the cross section of the outer sheath 10 matches a shape and a size of the wall of the metal pipeline 90 to allow close attachment of the outer sheath 10 and the wall of the metal pipeline 90 and effectively improve a signal to noise ratio (SNR) and a resolution of the fully distributed magnetic adsorption multi-parameter sensing cable 100. Specifically, the outer sheath 10 is attached to an inner wall or an outer wall of the metal pipeline 90 depending on different application scenarios, construction methods, and test methods. As shown in FIGS. 1 and 2, when the outer sheath 10 is attached to the outer wall of the metal pipeline 90, the side of the cross section of the outer sheath 10 perpendicular to the axial direction of the outer sheath 10 and attached to the outer wall of the metal pipeline 90 is a concave arc. As shown in FIGS. 3 and 4, when the outer sheath 10 is attached to the inner wall of the metal pipeline 90, the side of the cross section of the outer sheath 10 perpendicular to the axial direction of the outer sheath and attached to the inner wall of the metal pipeline 90 is a convex arc. An axial direction of the metal pipeline 90 and the axial direction of the outer sheath 10 are same.

It is able to be understood that when a cross section of the metal pipeline 90 perpendicular to the axial direction of the metal pipeline 90 is a square or another polygon, the side of the outer sheath 10 attached to the wall of the metal pipeline 90 is planar.

Preferably, two sides adjacent to the arc-shaped side of the outer sheath 10 are parallel to each other to arrange the single fully distributed magnetic adsorption multi-parameter sensing cable 100 on the wall of the metal pipeline 90. It is able to be understood that when multiple fully distributed magnetic adsorption multi-parameter sensing cables 100 are parallel, two sides adjacent to the arc-shaped side of the outer sheath 10 are tilted relative to each other to allow two adjacent fully distributed magnetic adsorption multi-parameter sensing cables 100 to attach to each other, which is convenient to straighten lines.

The outer sheath 10 is made of a flexible material with a low Young's modulus. The outer sheath 10 reduces the attenuation of external strain and temperature effects, thereby the intensity of the sensing signal in the sensing component 20 is increased. Accordingly, the strain and temperature sensitivity of the fully distributed magnetic adsorption multi-parameter sensing cable 100 are improved, as well as the actual test results in the fields of well oil and gas exploration and pipeline leakage monitoring. Preferably, the outer sheath 10 is made of polyvinyl chloride (PVC).

Referring to FIG. 2 and FIG. 4, the sensing component 20 is coaxially aligned with the outer sheath 10 to balance stresses on the fully distributed magnetic adsorption multi-parameter sensing cable 100. The sensing component 20 comprises an elastic sensitizing component 21, multiple sensing fibers 22, and a sensitizing curing layer 23. Specifically, when a quantity of the sensing fibers 22 is two or more, the sensing fibers 22 are uniformly arranged on a periphery of the elastic sensitizing component 21 along an axial direction of the elastic sensitizing component 21.

The periphery of the elastic sensitizing component 21 is coated with glue to form the sensitizing curing layer 23 which is wrapped around the elastic sensitizing component 21 and the sensing fibers 22. The sensitizing curing layer 23 strengthens the connection between the sensing fibers 22 and the elastic sensitizing component 21 and protects them both. Preferably, the elastic sensitizing component 21 is made of a flexible material with a Young's modulus of less than 1 GPa.

Each of the sensing fibers 22 comprises a strain sensing fiber 223 (shown in FIG. 5) and a temperature sensing fiber 224 (shown in FIG. 6), so as to realize the integrated measurement of sound waves, strain and temperature signals. Specifically, the strain sensing fiber 223 is sensitive to sound waves and strain, and the strain sensing fiber 223 and the temperature sensing fiber 224 are disposed on the peripheral side of the elastic sensitizing component 21 and opposite to each other.

Figure 5:
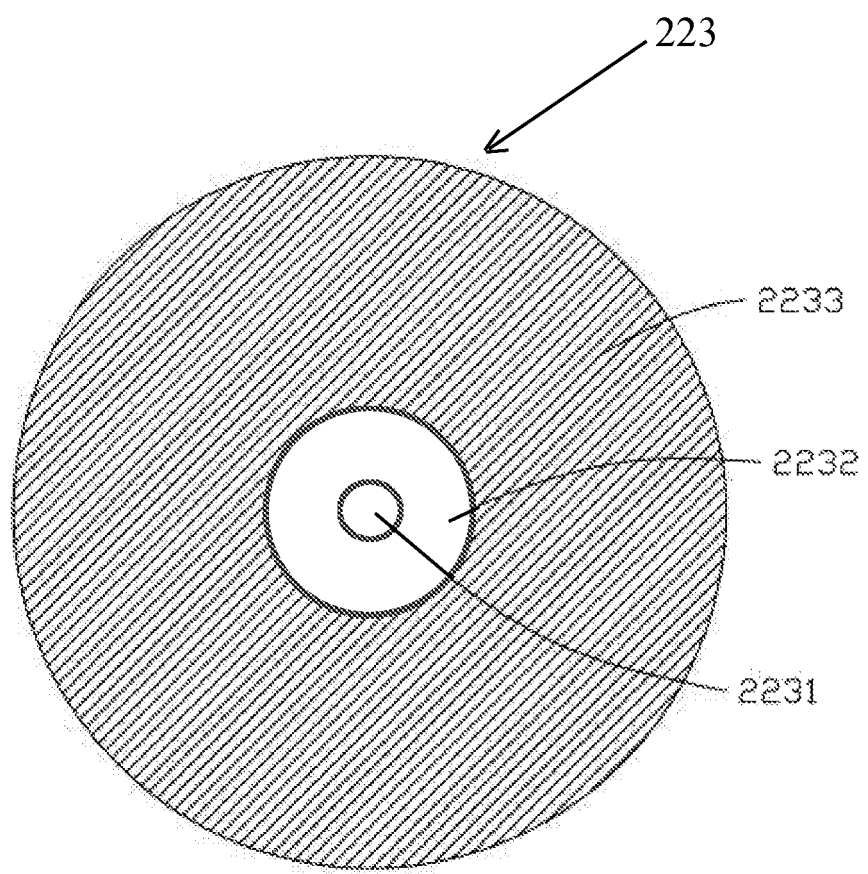
FIG. 5 is a structurally schematic diagram of a strain sensing fiber provided by the present invention.

Referring to FIG. 5, the strain sensing fiber 223 comprises a strain sensing fiber core 2231, a strain sensing fiber cladding 2232 wrapped around the train sensing fiber core 2231, and a strain sensing fiber coating 2233 wrapped around the strain sensing fiber cladding 2232. The strain sensing fiber cladding 2232 has a diameter in a range of 40 μm to 125 μm. The strain sensing fiber cladding 2232 is made of quartz or doped quartz, so that it has a Young's modulus equal to that of pure quartz, or less. The strain sensing fiber coating 2233, made of materials with a Young's modulus in a range of 0.1 MPa to 1 GPa, has a diameter in a range of 100 μm or greater. Of course, the strain sensing fiber 223 is able to be one or more members selecting from a group consisting of a standard single-mode fiber, a large-effective-area fiber, a scattering enhanced fiber, and a microstructure fiber with bend-resistant properties.

In order to clearly illustrate the beneficial effects of the strain sensing fiber 223 in the fully distributed magnetic adsorption multi-parameter sensing cable 100, the working principle of the strain sensing fiber 223 is described in detail as follows.

The DOFS technology is able to be used for detecting sound waves and strain. The DAS technology uses Rayleigh backscattered light in the fiber to measure sound waves. Since the Rayleigh backscattered light is sensitive to strain, changes in the external sound field cause changes in the length and refractive index of the sensing fiber, thus the phase difference of the signal propagating at adjacent points of the fiber is changed. By demodulating the phase difference of the Rayleigh backscattered light, the frequency, amplitude and phase of the external sound field is quantitatively restored, so as to realize sound waves measurement for long-distance and large-area. In addition, because the amount of Brillouin frequency shift in fiber is linear with static strain, the BOTDA technology is able to be used to perform distributed static strain measurement. A strain sensitivity Mp of the fiber for DAS technology is calculated using a following equation (equation I) of:

$$M_P = \frac{\Delta\varphi(1-2\mu)}{\varepsilon E}, \quad (I)$$

here, $\Delta\varphi$ is a phase difference of Rayleigh backscattered light, $\varepsilon$ is fiber strain, $E$ and $\mu$ are Young's modulus and Poisson's ratio of a fiber core, respectively. According to the equation I, when the Young's modulus of the fiber decreases, its strain sensitivity will be improved with other conditions unchanged. The fiber core and cladding are mostly made of quartz. To ensure the transmission characteristics of signal light, the Young's modulus of the fiber core is only able to be changed within a small range. At the same time, the strain sensitivity of the fiber is able to be effectively improved by reducing the diameter of the fiber core, reducing the Young's modulus of the fiber cladding through doping of phosphorus or other elements, and increasing the diameter of the fiber coating with low Young's modulus. Therefore, by using the strain sensing fiber cladding 2232 and the strain sensing fiber coating 2233 both of which are made of a low Young's modulus material, and setting a small diameter for the strain sensing fiber cladding 2232 and a large diameter for the strain sensing fiber coating 2233, the strain sensitivity of the strain sensing fiber 223 is able to be effectively improved.

Figure 6:
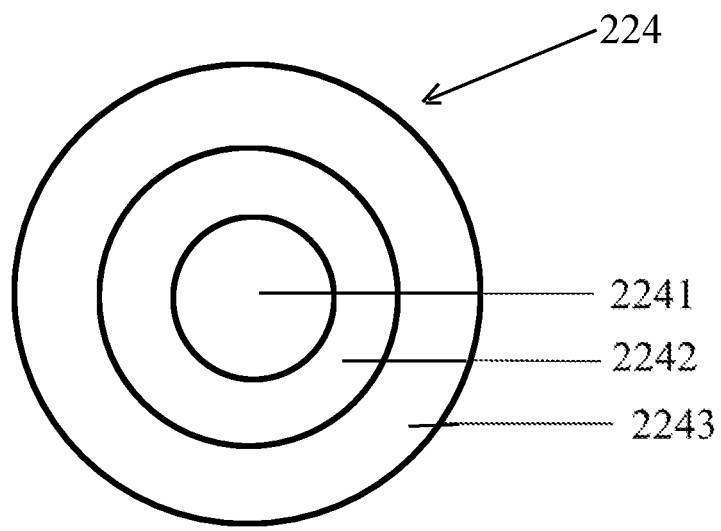
FIG. 6 is a structurally schematic diagram of a temperature sensing fiber provided by the present invention.

Referring to FIG. 6, the temperature sensing fiber 224 comprises a temperature sensing fiber core 2241, a temperature sensing fiber cladding 2242 wrapped around the temperature sensing fiber core 2241, and a temperature sensing fiber coating 2243 wrapped around the temperature sensing fiber cladding 2242. Of course, the temperature sensing fiber 224 is able to be a multimode fiber with flexural properties and has a core diameter of 50 μm or 62.5 μm.

In order to clearly illustrate the beneficial effects of the temperature sensing fiber 224 in the fully distributed magnetic adsorption multi-parameter sensing cable 100, the working principle of the temperature sensing fiber 224 is described in detail as follows.

The DOFS technology is also able to be used for temperature measurement. Since the fiber core and the cladding are made of quartz, when the external temperature field changes, thermal effects cause lattice oscillation in the fiber, resulting in Raman scattering of the interaction between optical particles and molecular electrons, generating Stokes light having a wavelength longer than that of incident signal light and anti-Stokes light having a wavelength shorter than that of incident signal light. Since the intensity of anti-Stokes light is sensitive to temperature, and that of Stokes light is independent of temperature, the local temperature is able to be derived from the ratio of the intensity of Stokes light and anti-Stokes light. DTS technology is based on the above principles to achieve the temperature measurement.

The FDMARs 30 are symmetrically disposed at both sides of the sensing component 20, and are axially arranged in the outer sheath 10, so that the fully distributed magnetic adsorption multi-parameter sensing cable 100 is balanced in force. Preferably, each of the FDMARs 30 is cylindrical, and a cross section of the each of the FDMARs 30 perpendicular to an axial direction thereof is round. The each of the FDMARs 30 is made of a continuous magnetic material, and is arranged in the outer sheath 10 in a fully distributed manner. Compared with the existing intermittently arranged FDMARs, the FDMARs 30 provided by the present invention has better adsorption effect, and are able to make one side of the outer sheath 10 compactly attached to the wall of the metal pipeline 90, thereby further making the fully distributed magnetic adsorption multi-parameter sensing cable 100 compactly attached to the wall of the metal pipeline 90. Compared with non-magnetic sensing cables in a freely approaching state in practical applications, the fully distributed magnetic adsorption multi-parameter sensing cable 100 is attached to the wall of the metal pipeline 90 through the FDMARs 30, reducing clutter waves caused by free state of cables, so that the coupling effect of the strain and temperature is improved, and distributed measurement with a higher SNR is realized.

The magnetic adsorption force between the each of the FDMARs 30 and the wall of the metal pipeline 90 is adjusted according to actual needs by changing a size of the each of the FDMARs 30 and a distance between the each of the FDMARs 30 and the metal pipeline 90. The magnetic adsorption force of the fully distributed magnetic adsorption multi-parameter sensing cable 100 and the wall of the metal pipeline 90 increases with a radius of the each of the FDMARs 30, and decreases with the distance between the each of the FDMARs 30 and the wall of the metal pipe 90. In order to clearly illustrate the beneficial effects of the above-mentioned FDMARs 30 in the fully distributed magnetic adsorption multi-parameter sensing cable 100, the working principle of the FDMARs 30 is described as follows in detail.

First, the following magnetostatic equation (equation II) is Gaussian magnetic law of:

$$\nabla \cdot B = 0 \qquad (II).$$

A magnetic field strength H of a magnetic material is expressed by an equation III of:

$$H = \frac{B}{\mu_0} - M, \qquad (III)$$

here, B is a magnetic flux density, $\mu_0$ is a magnetic permeability, and M is a magnetization vector field. For linear magnetic materials, a magnetization intensity is proportional to a magnetic field strength, which is expressed by a following equation (equation IV) of:

$$M = X_m H \qquad (V),$$

here, $X_m$ is a magnetic susceptibility. The relationship of the magnetic susceptibility with magnetic flux density B is expressed by a following equation (equation V) of:

$$B = \mu_0 H + M = \mu_0 (1 + X_m) H \qquad (V).$$

At the same time, the magnetic field strength field of linear magnetic materials without free current is a non-rotation field, that is, there is a scalar potential (i.e. $V_m$) which is expressed by a following equation (equation VI) of:

$$H = -\nabla V_m \qquad (VI).$$

The static magnetic field at this time is expressed by an equation VII of;

$$-\nabla \cdot (\mu_0 \mu_r \nabla V_m) = 0 \qquad (VII).$$

Using the above equations, the magnetic adsorption force between the fully distributed magnetic adsorption multi-parameter sensing cable 100 and the metal pipeline 90 is calculated. Assuming that the metal pipeline 90 made of iron has a diameter of 10 cm, a wall thickness of 1 cm, and a relative magnetic permeability of 7000, the material of the FDMAR 30 is able to be a neodymium iron boron magnet with a magnetization intensity of 900 KA/m and a density of 7600 kg/m$^3$.

Figure 7:
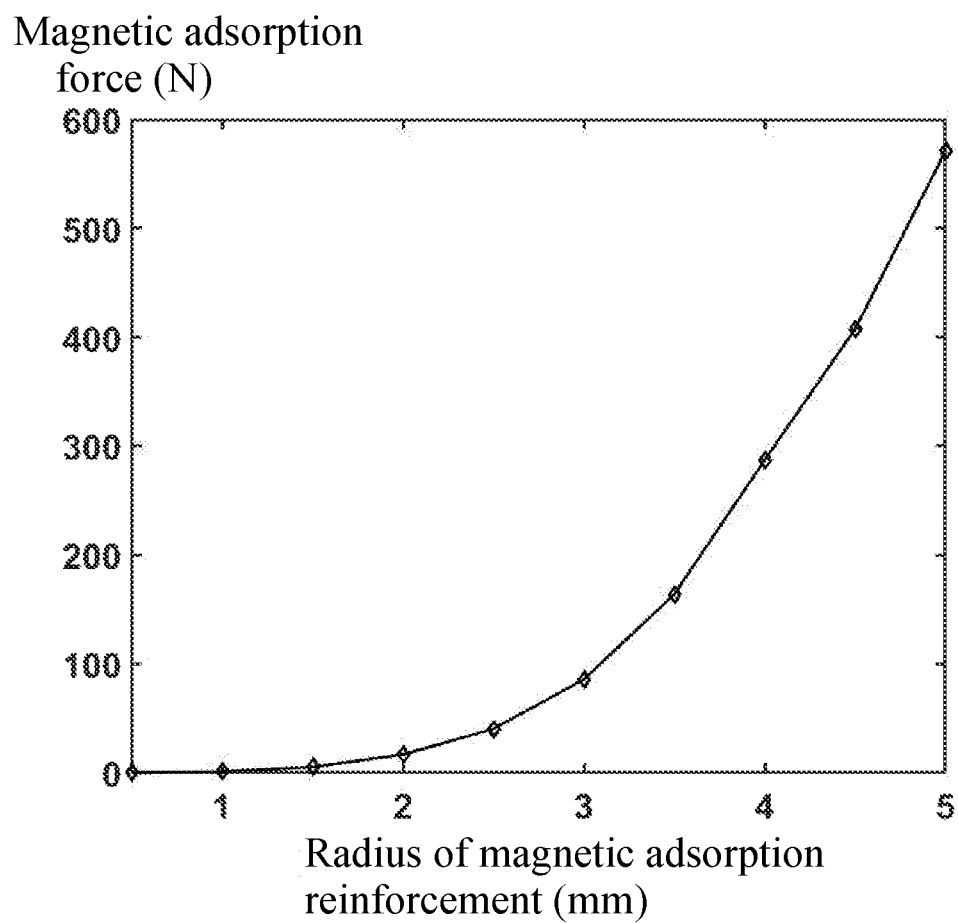
FIG. 7 shows a relationship between a radius of a FDMAR and a magnetic adsorption force according to the present invention.
Figure 8:
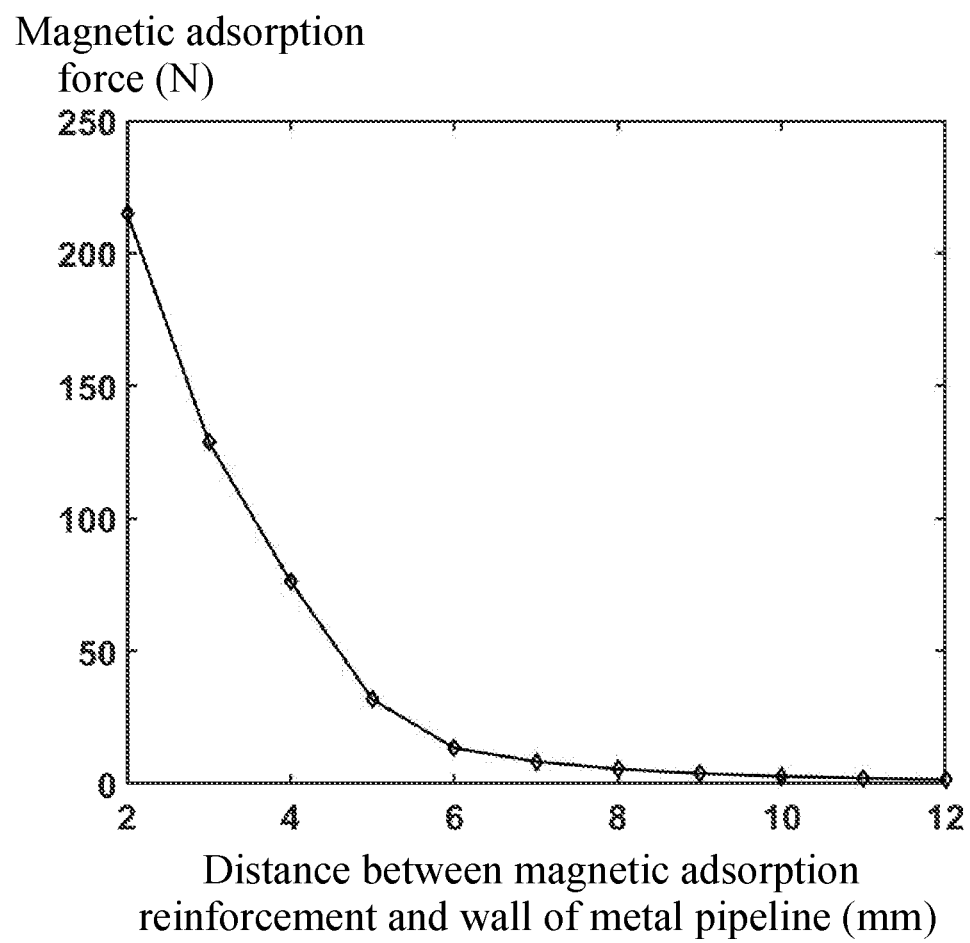
FIG. 8 shows a relationship between a distance from a center of the FDMAR to a wall of a metal pipeline and the magnetic adsorption force according to the present invention.

Referring to FIG. 7 and FIG. 8, the size of each of the FDMARs 30 and the positions of the FDMARs 30 in the outer sheath 10, that is, a distance between a center of the cross section of the each of the FDMARs 30 and the wall of the metal pipeline 90, are calculated to obtain a relationship with the magnetic adsorption force. FIG. 7 shows the relationship between the magnetic adsorption force of the fully distributed magnetic adsorption multi-parameter sensing cable 100 and the wall of the metal pipeline 90 and the radius of the each of the FDMARs 30 when the distance between the center of the cross section of the each of the FDMARs 30 and the wall of the metal pipeline 90 is 6 mm. It is able to be seen that the magnetic adsorption force between the two increases with an increase in the radius of the each of the FDMARs 30.

FIG. 8 shows a relationship between the magnetic adsorption force of the fully distributed magnetic adsorption multi-parameter sensing cable 100 and the wall of the metal pipeline 90 and the distance between the center of the cross section of each of the FDMARs 30 and the wall of the metal pipeline 90 when the radius of the cross section of each of the FDMARs 30 is 2 mm. It is able to be seen that the magnetic adsorption force between the two decreases as the distance between the each of the FDMARs 30 and the wall of the metal pipeline 90 becomes larger.

According to FIGS. 7 and 8, the magnetic adsorption force of the each of the FDMARs 30 and the wall of the metal pipeline 90 is changed according to actual needs by changing the size of the each of the FDMARs 30 and adjusting the distance between the each of the FDMARs 30 and the wall of the metal pipeline 90. It is able to be understood that, after manufacture of the fully distributed magnetic adsorption multi-parameter sensing cable 100, the magnetic adsorption force between the each of the FDMARs 30 and the metal pipeline 90 is also able to pass through adding a or some spacers between the corresponding outer sheath 10 and the metal pipeline 90 for adjustment.

Preferably, the outer sheath 10 is made of PVC and has a size of 15 mm×30 mm. An equivalent density of the fully distributed magnetic adsorption multi-parameter sensing cable 100 is 1500 kg/m$^3$. A coefficient, µ of friction between iron and PVC is 0.3, a radius of the tensile strength reinforcement 40 is 1.5 mm, and an equivalent density thereof is 7800 kg/m$^3$. Take a part of the fully distributed magnetic adsorption multi-parameter sensing cable 100 with a length of 0.5 as an example for analysis, an overall gravity of the fully distributed magnetic adsorption multi-parameter sensing cable 100 is $F_g = 3.901$ N. When the radius of the FDMAR 30 is 2 mm and the distance from the wall of the metal pipe 90 is 6 mm, a magnetic adsorption force $F_N$ of each FDMAR 30 is 16.56 N, and static friction caused by the magnetic adsorption force at this time is shown by an equation (equation VIII) of:

$$f = \mu \cdot F_N = 0.3 \times 16.56 \times 2 = 9.936 \text{ N} \qquad (VIII).$$

It is able to be known from $f>F_g$ that the fully distributed magnetic adsorption multi-parameter sensing cable 100 closely and strongly attaches to the wall of the metal pipeline 90.

Preferably, there are two FDMARs 30 and two tensile strength reinforcements 40 wherein the two tensile strength reinforcements 40 are disposed between the sensing component 20 and the two FDMARs 30, respectively, and are symmetrically disposed on both sides of the sensing component 20, so that the fully distributed magnetic adsorption multi-parameter sensing cable 100 is balanced in force. Each of the tensile strength reinforcements 40 is in the shape of a cylinder for increasing mechanical properties of the fully distributed magnetic adsorption multi-parameter sensing cable 100 and preventing breakage in use of the fully distributed magnetic adsorption multi-parameter sensing cable 100.

In the above-mentioned fully distributed magnetic adsorption multi-parameter sensing cable 100, one side of the outer sheath 10 is arc-shaped and attached to the wall of the metal pipeline 90 to enhance the degree of attachment of the fully distributed magnetic adsorption multi-parameter sensing cable 100 and the wall of the metal pipeline 90, and then effectively improves the SNR and resolution of the fully distributed magnetic adsorption multi-parameter sensing cable 100. The sensing fiber 22 comprises a strain sensing fiber 223 and a temperature sensing fiber 224, so as to realize integrated measurement of sound waves, strain and temperature signals. The fully distributed magnetic adsorption multi-parameter sensing cable 100 is attached to the wall of the metal pipeline 90 through the FDMARs 30 to reduce clutter waves caused by free state and improve the coupling effect of strain of the fully distributed magnetic adsorption multi-parameter sensing cable.

The features and performance of the present invention will be described in detail in combination with specific embodiments as follows.

First Embodiment

Referring to FIG. 1 and FIG. 2, in order to improve the adsorption effect of the fully distributed magnetic adsorption multi-parameter sensing cable 100 outside the wall of the metal pipeline 90, one side of the cross section of the outer sheath 10 perpendicular to the axial direction of the outer sheath 10 and attached on the outer wall of the metal pipeline 90 is a concave arc. The outer sheath 10 is made of a flexible material, and is more sensitive to sound waves and strain. Two FDMARs 30 are symmetrically disposed on both sides of the sensing component 20, so as to increase the magnetic suction attraction between the fully distributed magnetic adsorption multi-parameter sensing cable 100 and the outer wall of the metal pipe 90. Two tensile strength reinforcements 40 are configured to increase the mechanical properties of the fully distributed magnetic adsorption multi-parameter sensing cable 100 and prevent it from breaking during use.

Every sensing fiber 22 comprises a strain sensing fiber 223 and a temperature sensing fiber 224. The sensing fiber 22 and the elastic sensitizing component 21 are configured to increase the sensitivity of sound waves, strain and temperature of the fully distributed magnetic adsorption multi-parameter sensing cable 100. The sensitizing curing layer 23 fixes and protects the sensing fiber 22 and the elastic sensitizing component 21. When the external sound field and temperature field change, the fully distributed magnetic adsorption multi-parameter sensing cable 100 is used as a sensing medium of the DOFS system, and is able to transmit the external physical quantity information to the receive end of the DOFS. In oil and gas exploration applications, the sound source generates sound waves and transmits the sound waves to the fully distributed magnetic adsorption multi-parameter sensing cable 100 in the well. The fully distributed magnetic adsorption multi-parameter sensing cable 100 is then deformed. The phase information of the signal light in the sensing fiber 22 in the fully distributed magnetic adsorption multi-parameter sensing cable 100 is demodulated by DAS system, so that information such as sound source and geological structure are reversed to achieve high efficiency, high performance and low cost of vertical seismic profile measurement. Compared with the traditional electronic seismometer, which is only sensitive to mechanical vibration waves and is unable to achieve temperature measurement, the DTS technology is able to detect the temperature gradient changes in the well with the fully distributed magnetic adsorption multi-parameter sensing cable 100 in real time, which is helpful to provide guidance for exploration and construction in wells. In addition, BOTDA technology is more suitable for static strain measurement, so it is able to permanently monitor casing deformation in the well.

Second Embodiment

Referring to FIG. 3 and FIG. 4, in order to improve the magnetic absorption effect of the fully distributed magnetic adsorption multi-parameter sensing cable 100 in the inner wall of the metal pipeline 90, the side of the cross section of the outer sheath 10 perpendicular to the axial direction of the outer sheath 10 and attached to the inner wall of the metal pipeline 90 is a convex arc. The outer sheath 10 is provided with symmetrical components comprising the strain sensing fiber 223, the temperature sensing fiber 224, the FDMARs 30 and the tensile strength reinforcements 40 to better couple external sound waves, strain and temperature signals to the strain sensing fiber 223 and the temperature sensing fiber 224 in the fully distributed magnetic adsorption multi-parameter sensing cable 100, there is less clutter wave, and the overall system performance is higher. In the application scenario of prospecting oil and gas information by a distributed sensing system, the fully distributed magnetic adsorption multi-parameter sensing cable 100 as a sensing medium is able to transmit the external physical quantity change information to the receive end of the sensing system when the external sound field and temperature field change.

Third Embodiment

In addition, in the field of monitoring leakage of a pipeline, DOFS technology is able to locate the pipeline leaks, improve maintenance efficiency, and reduce production losses. In the field of monitoring leakage of a pipeline, the fully distributed magnetic adsorption multi-parameter sensing cable 100 is compactly adsorbed to the wall of the metal pipeline 90. When the metal pipeline 90 leaks, the metal pipeline 90 adsorbed by the fully distributed magnetic adsorption multi-parameter sensing cable 100 deforms, causing the fully distributed magnetic adsorption multi-parameter sensing cable 100 to deform, using DOFS technology to locate the position and degree of deformation of the metal pipeline 90 in real time. At the same time, when the leakage of the metal pipeline 90 causes the external temperature of the fully distributed magnetic adsorption multi-parameter sensing cable 100 to change, the temperature sensing fiber 224 is able to quickly conduct heat, and the leakage position is able to be further located by using the DTS technology. Through the combination of a variety of DOFS technology, repairs become accurate and timely.

The above three embodiments show that the fully distributed magnetic adsorption multi-parameter sensing cable 100 enhances the degree of attachment with the metal pipeline 90 when being used, reduces clutter signal interference in actual detection, and effectively improves the strain and temperature sensitivity of the fully distributed magnetic adsorption multi-parameter sensing cable 100, and improves the overall performance of DOFS technology in use for prospecting oil and gas exploration in well and monitoring leakage of pipelines.

The above embodiments are only used to illustrate the technical solutions of the embodiments of the present application, not to limit the present invention. Although the present application is described in detail with reference to the above preferred embodiments, those skilled in the art should understand that modifications or equivalent replacements to the technical solutions of the present application should not depart from the spirit and scope of the technical solutions of the present application.

What is claimed is:

1. A fully distributed magnetic adsorption multi-parameter sensing cable which is installed on a wall of a metal pipeline, the multi-parameter sensing cable comprising an outer sheath, a sensing component arranged in the outer sheath, and a magnet arranged in the outer sheath and on a peripheral side of the sensing component, wherein:

the outer sheath is attached to the wall of the metal pipeline by the magnet, and a magnetic adsorption force between the magnet and the wall of the metal pipeline is adjusted by changing a size of the magnet and a distance between the magnet and the wall of the metal pipeline;

the sensing component comprises an elastic sensitizing component, a sensing fiber, and a sensitizing curing layer; the sensing fiber is disposed on a peripheral side of the elastic sensitizing component, the sensitizing curing layer is coated on the elastic sensitizing component and the sensing fiber;

the sensing fiber comprises a strain sensing fiber and a temperature sensing fiber; the strain sensing fiber and the temperature sensing fiber are relatively disposed on the peripheral side of the elastic sensitizing component;

the strain sensing fiber comprises a strain sensing fiber core, a strain sensing fiber cladding wrapped around strain sensing fiber core, and a strain sensing fiber coating wrapped around the strain sensing fiber cladding, the strain sensing fiber cladding has a diameter in a range of 40 μm to 125 μm, and the strain sensing fiber coating has a diameter in a range of 100 μm or greater.

2. The fully distributed magnetic adsorption multi-parameter sensing cable of claim 1, wherein the temperature sensing fiber comprises a temperature sensing fiber core, a temperature sensing fiber cladding wrapped around the temperature sensing fiber core, and a temperature sensing fiber coating wrapped around the temperature sensing fiber cladding.

3. The fully distributed magnetic adsorption multi-parameter sensing cable of claim 1, wherein the temperature sensing fiber is a multimode fiber with a core diameter of 50 μm or 62.5 μm.

4. The fully distributed magnetic adsorption multi-parameter sensing cable of claim 1, wherein the magnet is cylindrical, a cross section of the magnet perpendicular to an axial direction thereof is round.

5. The fully distributed magnetic adsorption multi-parameter sensing cable of claim 2, wherein the magnet is cylindrical, a cross section of the magnet perpendicular to an axial direction thereof is round.

6. The fully distributed magnetic adsorption multi-parameter sensing cable of claim 3, wherein the magnet is cylindrical, a cross section of the magnet perpendicular to an axial direction thereof is round.

7. The fully distributed magnetic adsorption multi-parameter sensing cable of claim 1, wherein the magnet is a neodymium iron boron magnet with a magnetization intensity of 900 KA/m and a density of 7600 kg/m$^3$.

8. The fully distributed magnetic adsorption multi-parameter sensing cable of claim 2, wherein the magnet is a neodymium iron boron magnet with a magnetization intensity of 900 KA/m and a density of 7600 kg/m$^3$.

9. The fully distributed magnetic adsorption multi-parameter sensing cable of claim 3, wherein the magnet is a neodymium iron boron magnet with a magnetization intensity of 900 KA/m and a density of 7600 kg/m$^3$.

* * * * *